United States Patent [19]

Middelman et al.

[11] Patent Number: 5,592,737
[45] Date of Patent: Jan. 14, 1997

[54] METHOD OF MANUFACTURING A MULTILAYER PRINTED WIRE BOARD

[75] Inventors: Erik Middelman, Arnhem; Pieter H. Zuuring, Nijmegen, both of Netherlands

[73] Assignee: Akzo Nobel N.V., Arnhem, Netherlands

[21] Appl. No.: 157,077

[22] PCT Filed: May 19, 1992

[86] PCT No.: PCT/EP92/01133

§ 371 Date: Dec. 3, 1993

§ 102(e) Date: Dec. 3, 1993

[87] PCT Pub. No.: WO92/22192

PCT Pub. Date: Dec. 10, 1992

[30] Foreign Application Priority Data

Jun. 4, 1991 [NL] Netherlands ............................ 9100958

[51] Int. Cl.⁶ .......................... H05K 3/24; H05K 3/32; H05K 3/46; H05K 3/36
[52] U.S. Cl. ........................ 29/848; 29/830; 29/841; 156/233; 156/313; 174/255; 174/259; 174/260; 264/258; 428/901
[58] Field of Search .................... 29/830, 831, 832, 29/846, 848, 851, 841; 174/254, 255, 256, 260; 156/233, 313, 314, 315, 252; 427/96, 97; 428/413–416, 901; 264/258

[56] References Cited

U.S. PATENT DOCUMENTS

| | | | |
|---|---|---|---|
| 3,473,992 | 10/1969 | Martello et al. | 156/314 |
| 3,756,891 | 9/1973 | Ryan | 156/313 |
| 4,299,873 | 11/1981 | Ogihara et al. | 156/252 X |
| 4,404,059 | 9/1983 | Livshits et al. | 29/846 X |
| 4,501,787 | 2/1985 | Marchetti et al. | 428/901 X |
| 4,606,787 | 8/1986 | Pelligrino | 156/233 X |
| 4,847,136 | 7/1989 | Lo | 174/255 X |
| 4,875,282 | 10/1989 | Leibowitz | 29/830 |
| 4,943,334 | 7/1990 | Medney et al. | 264/258 X |
| 5,153,987 | 10/1992 | Takahashi et al. | 29/848 X |
| 5,282,312 | 2/1994 | DiStefano et al. | 29/830 |

FOREIGN PATENT DOCUMENTS

| | | | |
|---|---|---|---|
| 374319 | 6/1990 | European Pat. Off. | |
| 231737 | 4/1993 | European Pat. Off. | |
| 607534 | 7/1994 | European Pat. Off. | 29/830 |
| 3240754 | 5/1983 | Germany | 29/830 |
| 4007558 | 9/1990 | Germany | |
| 283996 | 11/1989 | Japan | |

OTHER PUBLICATIONS

R.C.A. Review, 29: 582–599 (Dec. 1968).
IBM Technical Disclosure Bulletin, vol. 32, No. 5B (Oct. 1989) p. 355.
C. F. Coombs, Jr., Printed Circuits Handbook, 3rd Ed. Chapters 31,32,33 and 34 and Glossary.

*Primary Examiner*—Peter Vo
*Attorney, Agent, or Firm*—Richard P. Fennelly; Louis A. Morris

[57] ABSTRACT

A process for manufacturing a multi-layer printed wire board, also referred to as a multilayer, comprising at least two electrically insulating substrates with electrically conductive traces or layers provided on at least three surfaces thereof, in which process, by means of lamination under pressure, a cured basic substrate based on a UD-reinforced synthetic material, provided on either side with traces, is combined with and bonded to a back-up substrate, wherein during the laminating process the back-up substrate is added to the basic substrate, the back-up substrate comprising a UD-reinforced cured core layer provided at least on the side facing the conducting traces of the basic substrate with a still plastically deformable (flowable) adhesive layer, and such a pressure is exerted on the laminate as to bring said cured core layer of the back-up substrate into contact or practically into contact with the conducting traces of the basic substrate, and the space between these traces is filled with the adhesive material, so bonding the basic substrate and the back-up substrate.

22 Claims, 7 Drawing Sheets

METHOD OF MANUFACTURING A MULTILAYER PRINTED WIRE BOARD

The invention relates to a method of manufacturing a multilayer printed wire board. Such a printed wire board comprises at least three conductive layers, of which usually at least two layers are copper-layers on the outer surfaces and at least one layer is an internal circuit. The method to which the invention pertains comprises bonding by lamination at least one hard base substrate which is provided with conductive traces on both sides and at least one intermediate substrate which comprises a hard core layer provided with an adhesive layer at least at the side facing the conductive traces of the base substrate.

Such a method has been disclosed in IBM Technical Disclosure Bulletin Vol 32 No. 5B, pages 355–356, and serves to substantially eliminate the dimensional instability that usually occurs in composite lamination processes. While this can be recognized as a substantial improvement in the manufacture of multilayer boards, the disclosure fails to address an even more important problem associated with multilayer boards, viz. that of providing a material displaying thermal coefficients of expansion (TCE) sufficiently low so as to match the TCE of electronic components (chips) used in conjunction with the multilayer board. A woven glass fabric (cloth) being used as the reinforcement material it is immediately apparent to the person of ordinary skill in the art that the TCEs obtained are relatively high. Further, the prior art substrates and the resulting multilayer boards require improved dimension stability.

Similar considerations apply to U.S. Pat. No. 3,756,891, which discloses a method of manufacturing multilayer PWBs involving the stacking of circuitized boards with adhesive coated sheets. The adhesive is chosen so as not to flow into the through-hole interconnection areas present in the boards.

A different approach towards multilayer PWBs is the sequential laminating technique disclosed in RCA review 29 (1968) pages 582–599, particularly pages 596–597. Although a base-substrate provided with circuitry on both sides is laminated with an adhesive coated dielectric layer, the adhesive coated layer is not an intermediate substrate in between base substrates in accordance with the invention, but serves as a substrate for a next printed circuit. The disclosure does not address the type of substrate used, let alone that it can provide a solution to the problem of providing multilayer boards having sufficiently low TCEs.

PWBs providing advantages with respect to TCE have been disclosed in U.S. Pat. No. 4,943,334. Described is a manufacturing process which comprises winding reinforcing filaments about a square flat mandrel to form a plurality of layers of filaments intersecting at an angle of 90°, providing the plurality of layers with a curable matrix material, and curing the matrix so as to form a base material for a PWB. In order to provide multilayer PWBs the disclosure teaches a method comprising providing an assembly of PWBs in a cavity, introducing a curable matrix material into the cavity, and curing the matrix so as to form a multilayer PWB. The desired reinforcement of the matrix is obtained by the presence of fibres around the PWBs, which during the process will become embedded in the cured matrix. The method fails to provide acceptable suitable results due to, inter alia, an internal lack of thickness-tolerance.

In C. J. Coombs, jr.'s *Printed Circuits Handbook*, published by McGraw-Hill, chapters 31 and 32, more particularly 33 and 34, it is described, int. al., how a multiple layer printed wire board, a so-called multilayer, is generally manufactured, the process being comprised of the following steps:

manufacturing a laminate coated on both sides with copper foil from glass fabric-epoxy prepreg;

etching the desired pattern into the copper;

bonding the etched laminates by pressing them together with intermediate layers of glass fibre-epoxy prepreg.

There are a number of drawbacks to this process, such as high materials costs on account of glass fabric being employed and high thermal expansion on account of the low maximum fibre content in fibre-reinforced laminates. Another major drawback to this process is that there is no absolute thickness tolerance. The thickness of a multilayer formed in this manner is dependent on, int. al., the moulding pressure exerted, the moulding temperature and the warming-up rate employed, and the "age" of the used prepreg and some other factors which are hard to control.

There are several variations from the latter process, e.g., as disclosed in EP 0 231 737 A2. In this known process a multilayer printed wire board is manufactured in a continuous process. In the embodiment according to FIG. 2 of this publication use is made of a single printed wire board (PWB) comprised of a substrate of two layers of glass cloth in a cured matrix of thermosetting synthetic material, which substrate is provided on both sides with a layer of copper traces formed by the subtractive method from the copper foil originally applied to the substrate. To this initial PWB there are applied, on both sides, two layers of glass cloth, a layer of liquid thermosetting material, such as epoxy resin, and a copper foil. After preheating the whole is laminated in a double belt press under the effect of heat and pressure. Thus, after cooling as it leaves the double belt press, a laminate is obtained which after the forming of copper traces in the outer layers makes a multilayer PWB. Hence this multilayer PWB is made up of a laminate of three substrates of glass cloth-reinforced cured epoxy resin and four layers with copper traces.

Although quite reasonable results can be obtained using the multilayer PWB manufactured according to this known process, it still has certain drawbacks. Notably, the layers of liquid, not yet cured thermosetting resin are greatly pressed together in the double belt press, as a result of which there is a substantial decrease of the laminate's thickness between the double belt press's inlet and its outlet. It has been found that as a result of this major change in thickness it is hard to maintain with sufficient accuracy the constant thickness of the finished laminate and of the finished multilayer PWB as ultimately desired. Deviations in a PWB's thickness have an unfavourable effect on its electrical properties, thus negatively affecting the quality of such a PWB. Another drawback to said known multilayer PWB is that reinforcing the substrates with fabrics is a comparatively costly affair.

DE-4 007 558 A1 describes a multilayer PWB of a somewhat different type. Between a number of adjacent single PWBs (cf. FIG. 1, no. 2 of DE-4 007 558 A1) which are each composed of a substrate (cf. FIG. 1, no. 4) made up of a glass cloth impregnated with a thermosetting synthetic material and provided on both sides with copper traces (cf. FIG. 1, no. 5), there is interposed in each case a sort of intermediate substrate (FIG. 1, nos. 1-*a* and 1-*b*). The intermediate substrate (1) consists in this case of a polyimide film (1-*a*) of a thickness of 10 µm which is provided on both sides with an adhesive layer (1-*b*) of a thickness of 10 µm or less. The melting temperature of the polyimide film is higher than the temperature used during lamination, while the adhesive layers have a melting temperature below the used lamination temperature.

A disadvantage of said known multilayer PWB consists in that there is air in the voids between the copper traces (cf.

FIG. 1), which may have an unfavourable effect on the properties. Other disadvantages of DE-4 007 558 A1 include the high materials cost price of the described constituents and the lengthy processing time required.

In U.S. Pat. No. 4,606,787 a process for manufacturing a multilayer PWB is described which comprises first (cf. FIG. 12) making a stack of a number of single PWBs with sandwiched therebetween in each case a sort of intermediate substrate of glass fibres impregnated with liquid, uncured epoxy resin. Next, said stack is pressed together under pressure and at elevated temperature, with the resin filling the voids between the conductive traces (cf. column 6, 11. 51, 52) and being cured. The pressing together of the laminate gives a substantial reduction of its thickness, making it difficult to maintain with sufficient accuracy the constant overall thickness of the finished laminate as ultimately desired and the constant thickness of the individual intermediate substrates. This has an unfavourable effect on the PWB's electrical properties, thus negatively affecting its quality.

The invention has for its object to provide a method in which said drawbacks have been obviated. The process according to the invention consists therein that in a method of the known type referred to in the opening paragraph the adhesive layer is flowable and lamination is conducted under a pressure sufficiently high so as to bring the core layer of the intermediate substrate into contact or virtually into contact with the conductive traces of the base substrate, the adhesive filling the voids between the traces, the base substrate and the intermediate substrate comprising a fibre-reinforced matrix material, the reinforcement being in the form of a crosswise arrangement of layers of unidirectionally (UD) oriented fibres. A flowable adhesive generally is an adhesive which either is fluid or can be rendered fluid (usually by means of elevated temperature).

Thus, according to the invention, for the hard core layer of the intermediate substrate and as the hard base-substrate there is employed a reinforced matrix material which obviates the afore-mentioned drawbacks and notably has a sufficiently low TCE and advantageous flatness. This material comprises two or more layers of reinforcing fibres or filaments embedded in a cured thermosetting synthetic material based on, e.g., epoxy resin. The reinforcement is in the form of filament-containing layers composed of a plurality of mutually parallel stretched filaments not bound in the form of a fabric and extending substantially rectilinearly, and with filaments of superposed layers crossing each other. This type of reinforced matrix material is referred to as UD-reinforced material for short. According to the invention preferably three said filament layers not bound in the form of a fabric are arranged in the matrix material in mirror image relative to the plane of symmetry in this process, with the filaments of superposed filament layers crossing at an angle of preferably about 90°. This UD-reinforced material, more accurately referred to as a cross-ply of UD-reinforced layers, to be suitable for advantageous use in multilayer PWBs is balanced and mid-plane symmetric. An example of such a material is formed by the substrates disclosed in the afore-mentioned U.S. Pat. No. 4,943,334. By virtue of the lamination method according to the invention, making use of a flowable adhesive which is not substantially present between the conductive traces of a base-substrate and the hard core of an adjacent intermediate substrate, the advantages of UD-reinforced material can be employed in a multilayer PWB.

These advantages particularly include a favourable dimension stability. Further the substrates used have relatively low TCEs in the X and Y directions, preferably about equal to those of the electrically conductive material employed (usually copper). Further, it is possible to provide substrates having coefficients of expansion in the X and Y directions about equal to the coefficient of expansion of electronic components to be used in conjunction with the multilayer PWB, more particularly silicon chips. It should be noted that these components can be applied either onto the multilayer board ("chip-on-board"), or can be embedded in a substrate such as an intermediate substrate in accordance with the present invention ("chip-in-board"). With regard to the latter embodiment an adhesive-coated substrate should be provided with open spaces for embedding the chips. Of course, it is also possible to embed the chips in spaces provided in a base-substrate. An advantageous method to manufacture a "chip-in-board" structure includes placing one or more chips on a base-substrate (and connecting it conductively with the circuitry on the base-substrate), and then laminating onto the chip-containing base-substrate an adhesive-coated intermediate substrate provided with appropriate spaces so as to surround the chip or chips attached to the base-substrate.

A particularly effective embodiment of the process according to the invention is characterised in that use is made of an intermediate substrate which is provided on both sides of the hard core layer with the flowable adhesive layer. According to the invention in this case the intermediate substrate can be simply sandwiched between two adjacent base substrates provided with conductive traces, and such pressure is exerted on the laminate during the laminating process as will bring said hard core layer of the intermediate substrate into virtual contact with the conductive traces of the two base substrates and fill the void between these traces on either side of the intermediate substrate with the adhesive material. According to the invention, a multilayer PWB having many layers can be easily realised when each of n−1 intermediate substrates (n>2) is sandwiched between, in each case, n adjacent base substrates, followed by lamination under increased pressure (and optionally increased temperature), under vacuum, or under a combination of the two.

A favourable embodiment of the process according to the invention is characterised in that the thickness of the hard core layer of each intermediate substrate is 0,025–0,6 mm, although preferably the thickness of each intermediate substrate is of the same order of magnitude as that of a base substrate, and the thickness of each still plastically deformable (flowable) adhesive layer on one or both sides of the intermediate substrate is of the same order of magnitude as that of the conductive traces, which generally have a thickness of 2–70 μm. Preferably, the process according to the invention is characterised in that for the flowable adhesive layer provided on one or both sides of an intermediate substrate's hard core layer use is made of a glue based on a still uncured or only partially cured thermosetting synthetic material, such as epoxy resin, which is cured after the voids between the conductive traces have been filled.

BRIEF DESCRIPTION OF THE DRAWINGS

The invention will be further illustrated with reference to the schematic drawing.

Shown in FIG. 1 is the manufacture of a single PWB by means of the subtractive method.

Figure 8:
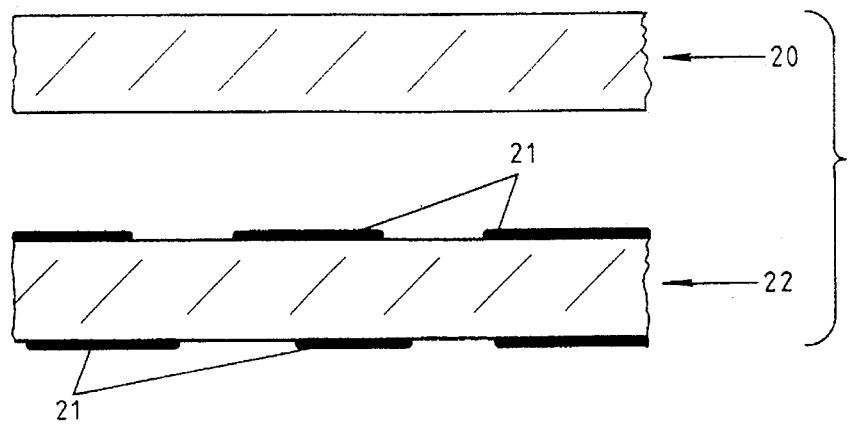

Shown in FIG. 8 is the manufacture of a known single PWB by means of the additive method.

FIGS. 9–12 show the manufacture by the additive method of a PWB having six layers of copper traces.

FIGS. 13–16 illustrate another procedure for the manufacture of a PWB having four or six layers of copper traces.

DETAILED DESCRIPTION OF THE PREFERRED EMBODIMENTS

Figure 1:
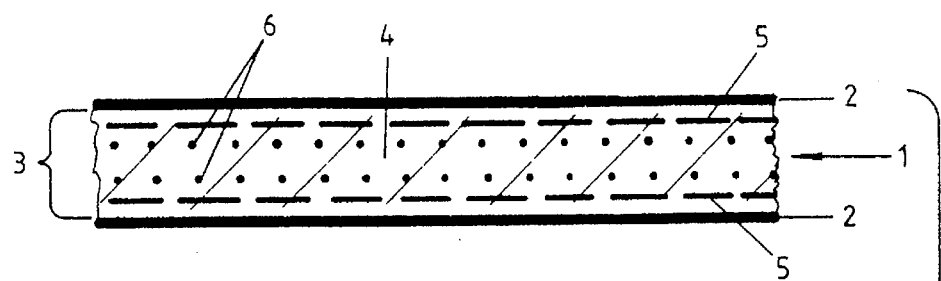
Figure 1:
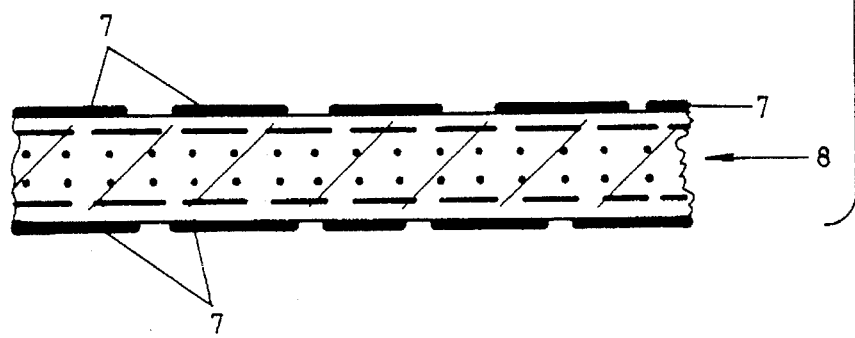

FIG. 1 shows a substrate 1, the outer sides of which are composed of a continuous copper foil 2 fixedly provided thereon. The core 3 of the substrate 1 is composed of a matrix 4 of a cured thermosetting synthetic material based on epoxy resin, which is reinforced with three layers of stretched filaments not bound in the form of a fabric and extending rectilinearly, with the combined thickness of the two outer layers being equal or virtually equal to the thickness of the centre layer. The two outer filament layers 5 are indicated with dash lines and the filaments in these layers extend mutually parallelly and parallel to the plane of the drawing (0° direction). The inner filament layer 6 is indicated with dotted lines and extends at right angles to the plane of the drawing (90° direction). In effect, the core 3, the thickness of which is, say, 0,4 mm, of the substrate 1 is made of layers of mutually parallel (unidirectional-UD) reinforcing filaments impregnated with a thermosetting material, such as epoxy resin. Next, the desired copper traces 7 having a thickness of, say, 35 µm, are formed in the copper foils by an etching process, i.e., by the subtractive method, after which the base substrate indicated in its entirety with 8 is finished.

Figure 2:
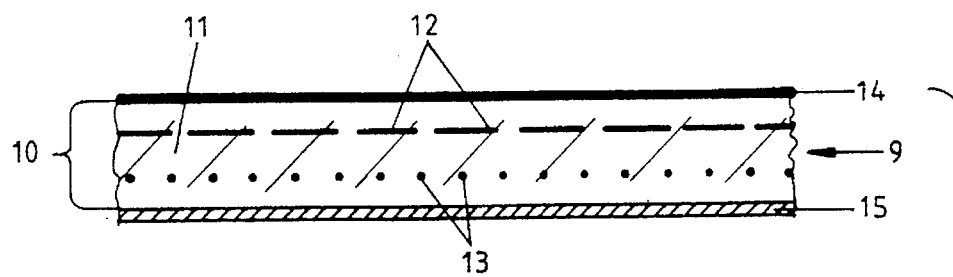
FIGS. 2–7 show the manufacture by the subtractive method of a PWB having six layers of copper traces.
Figure 2:
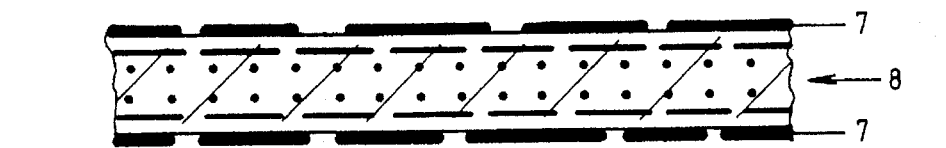
Figure 2:
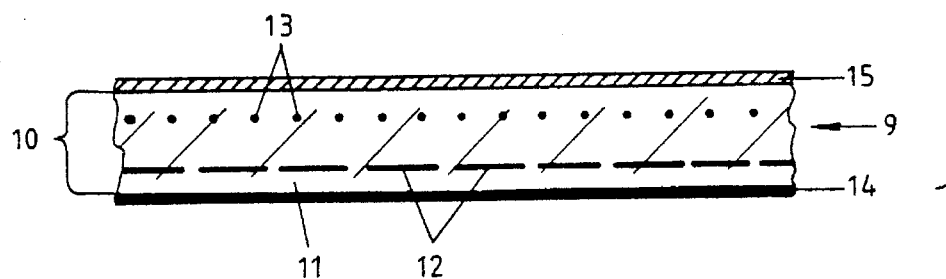
Figure 3:
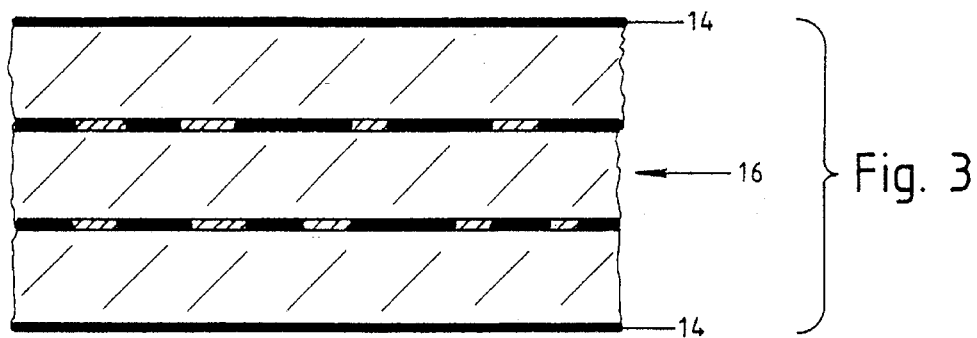
Figure 4:
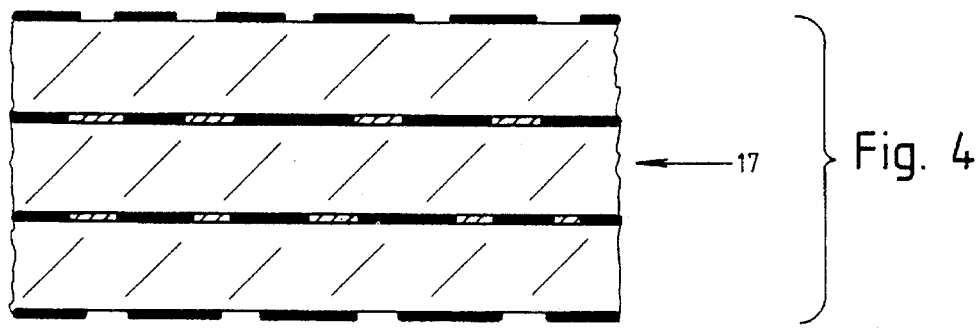

As will be illustrated in greater detail with reference to FIGS. 2–7, said base substrate 8, which in itself is a single PWB with two layers of copper traces, forms a building component for the manufacture of a multilayer PWB. To this end an intermediate substrate indicated in its entirety with 9 is applied to either side of the base substrate 8 in the manner indicated in FIG. 2. Each intermediate substrate 9 is made up of a hard core layer 10, which has a matrix 11 of a cured thermosetting resin, e.g. based on epoxy resin. The matrix 11 is reinforced with at least two unidirectional layers of reinforcing fibres. The filaments in the outer layers 12 of reinforcing fibres extend in the aforementioned 0° direction, while the filaments in the inner layers 13 of reinforcing fibres extend in the aforementioned 90° direction. The core 10 of the intermediate substrate 9, like the core 3 of the base substrate 8, is manufactured by laminating at least two layers reinforced with virtually unidirectional fibres, giving a hard core layer 10 with a thickness of, say, 0,4 mm. To the one side of each intermediate substrate 9 there is applied a copper foil 14 of a thickness of 35 µm. To the other side, i.e., the side facing the copper traces 7 of the base substrate 8, of each of the intermediate substrates 9 is applied a flowable adhesive layer 15 of a thickness of 35 µm. The adhesive layer 15 is composed of a quality type of glue and preferably an uncured epoxy resin or a partially cured epoxy resin. Preferably, the adhesive layer in the situation drawn in FIG. 2 is not sticky, so that the intermediate substrate can be handled without any problem. Next, the two intermediate substrates 9 with the base substrate 8 therebetween are stacked as indicated in FIG. 3, and joined together into an integrated whole under the effect of elevated temperature and external pressure. The pressing together of the stack shown in FIG. 3 is carried out under such a pressure as will bring the hard core layer 10 of the intermediate substrate 9 wholly or virtually into contact with the copper traces 7 of the base substrate and completely fill the void between these traces with glue or adhesive material 15. With the external pressure being maintained, the stack shown in FIG. 3 is subjected to such a temperature as will cure the glue 15 based on, say, epoxy resin. After the glue has been cured, a laminate 16 forming an integrated whole is obtained. Next, the outer copper foils 14 of the laminate 16 are subjected to an etching process according to the subtractive method to form the desired copper traces, giving the multilayer PWB 17 shown in FIG. 4. The PWB 17 already has four layers of copper traces.

Figure 5:
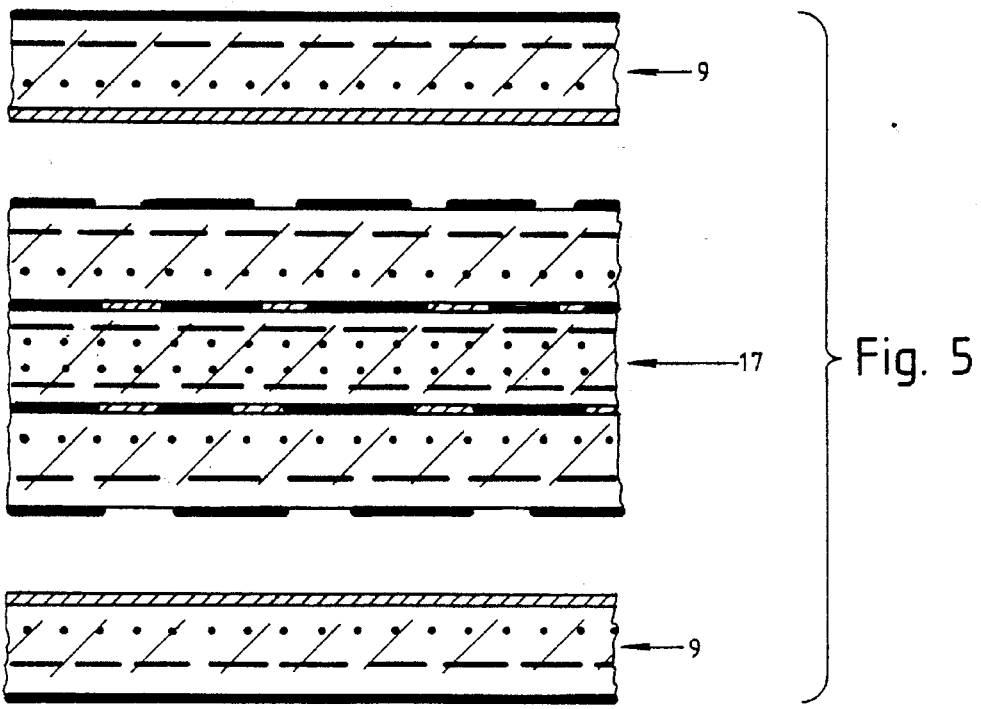
Figure 6:
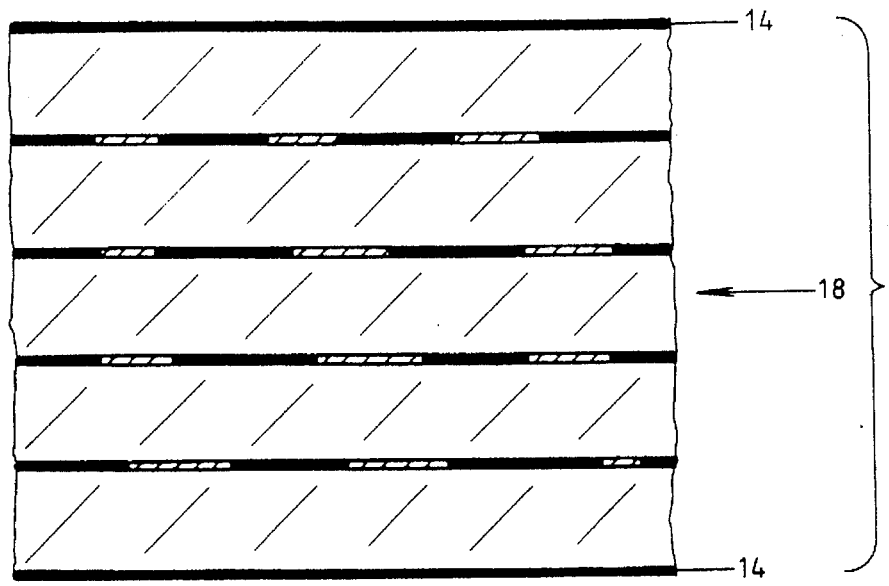
Figure 7:
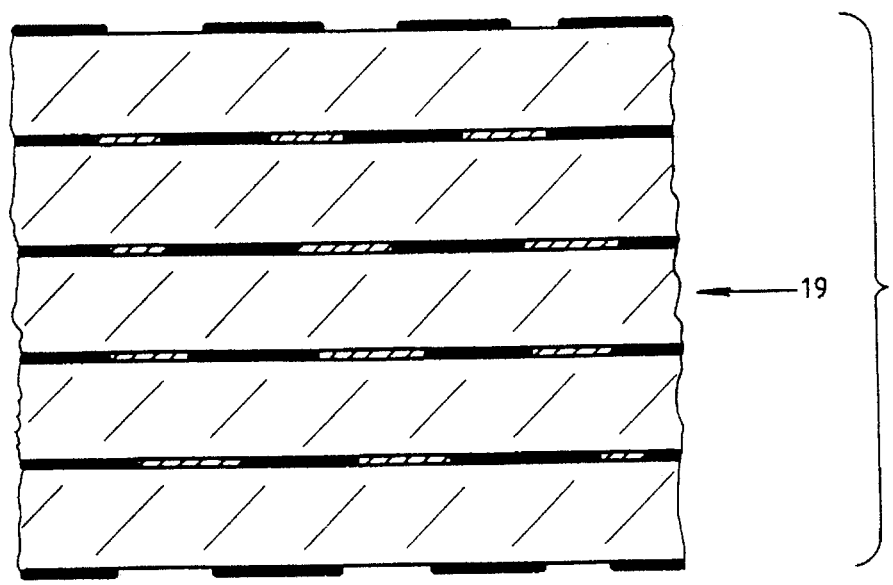

Manufacturing a PWB with six layers of copper traces may be as illustrated in FIGS. 5–7. The members of such a PWB are indicated in FIG. 5 and consist of the centrally located PWB 17 with on either side thereof another intermediate substrate 9 of the type described hereinbefore. In the manner indicated in FIG. 6 these three members are subsequently combined to form a stack 18, which is joined together into an intergrated whole under the effect of heat and pressure, in analogous manner to that described with reference to FIG. 3. The outer copper foils 14 of the laminate 18 are then subjected to an etching process according to the subtractive method to form the desired copper traces, giving the multilayer PWB 19 shown in FIG. 7. The PWB 19 has six layers of copper traces.

Making use of the PWB 19 combined with two intermediate substrates 9, a PWB of eight layers of copper traces (not shown) can be manufactured in a manner analogous to that illustrated in FIGS. 2–4 and FIGS. 5–7. Of course, it is also possible to manufacture a PWB with seven layers of copper traces, by combining the six-layer PWB 17 with an intermediate substrate 9 on one side only. It will be obvious that the principle described with reference to FIGS. 2–4 and FIGS. 5–7 permits the manufacture of PWBs with a plurality, say 20, layers of copper traces. To simplify the drawing the various layers of reinforcing filaments have not been drawn in FIGS. 3, 4, 6, and 7. Needless to say, the number of layers of reinforcing filaments is not restricted to that given in the drawing and more such layers can be used if desired. Care should preferably be taken to ensure that in the final PWB the number of layers of reinforcing filaments is disposed in mirror image relative to the plane of symmetry. This means that identical laminate layers are always disposed at even distance from the central plane of the multilayer above and below it, identical in this case standing for, of even thickness, with the same orientation, and of the same composition.

Shown in FIG. 8 is a substrate 20, of which the outer sides in contradistinction to the substrate of FIG. 1 have not been coated with a copper foil. Otherwise, the construction of the substrate 20 and its reinforcement with layers of reinforcing filaments is the same as for the substrate 1. The difference between the substrates 20 and 1 further consists in that the plastics matrix of the substrate 20 contains a catalyst, e.g. palladium. As a result there can be formed on the substrate 20 in a manner known in itself by the additivive method the copper traces 21, after which the base substrate indicated in its entirety with 22 is ready.

Figure 9:
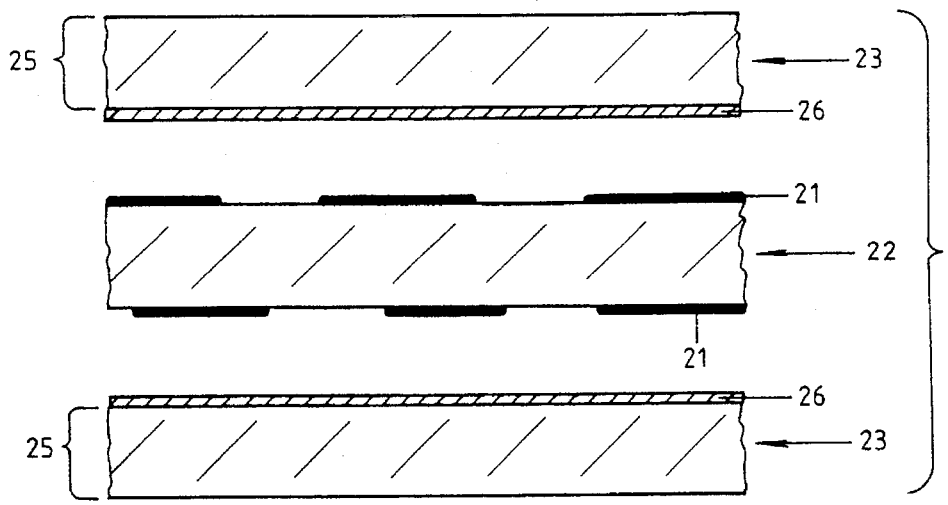
Figure 10:
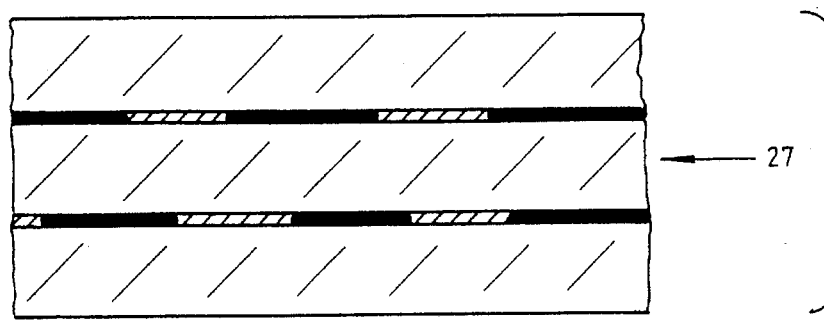
Figure 11:
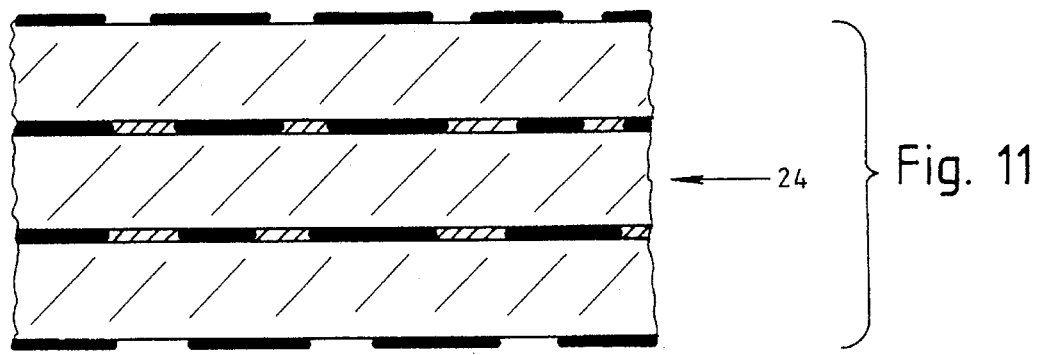

FIGS. 9–11 show that a PWB 24 with, in all, four layers of copper traces can also be manufactured by combining the base substrate 22 with two intermediate substrates 23. The process illustrated in FIGS. 9–11 is virtually wholly identical with the process of FIGS. 2–4, the principal difference being that the intermediate substrate 23 in the hard core layer 25 contain a catalyst and have no copper foil coating. The side of the intermediate substrate 23 facing the base substrates is again provided with a flowable adhesive layer 26, which is made up of a quality type of glue. In a manner analogous to that described for the laminate 16 of FIG. 3, the combination of layers shown in FIG. 9 is joined together under the effect of heat and pressure into an integral whole to form the laminate 27 shown in FIG. 10. Next, copper traces are applied to the outer sides of the intermediate substrates in the laminate 27 by the additive method, giving the finished multilayer PWB 24, which has four layers of copper traces.

Figure 12:
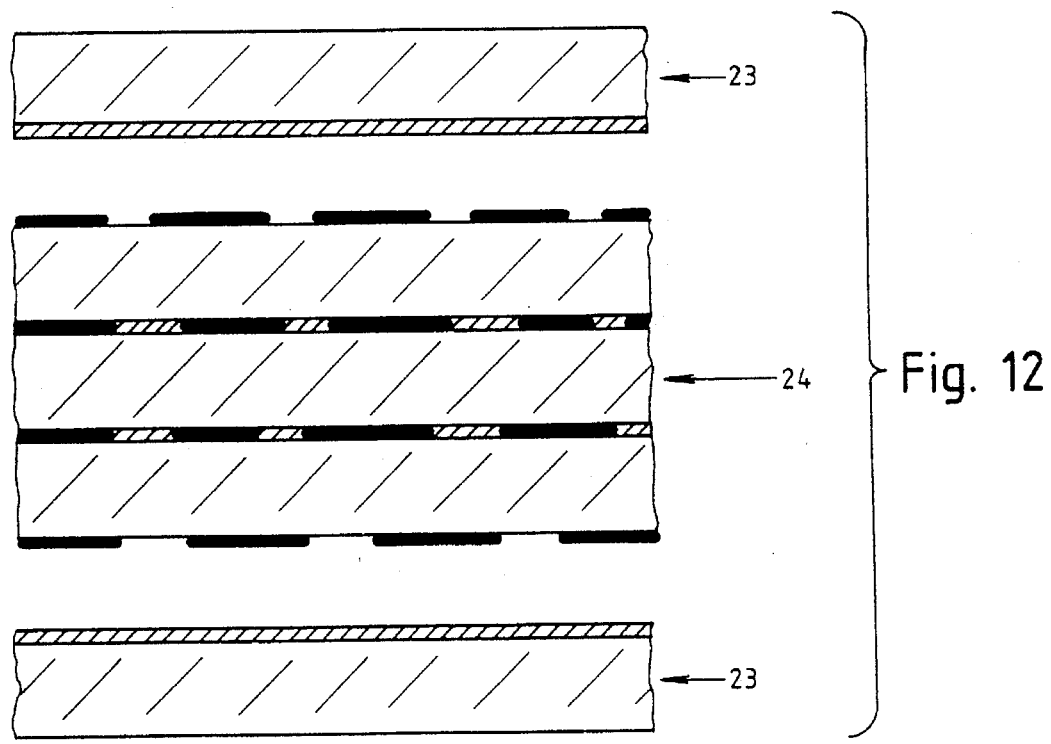

By being combined with two intermediate substrates 23 in the manner indicated in FIG. 12, the PWB 24 in its turn may serve as a building component for a PWB with six layers of copper traces, if desired. Subsequently, the corresponding process steps described with reference to FIGS. 10 and 11 have to be carried out.

Figure 13:
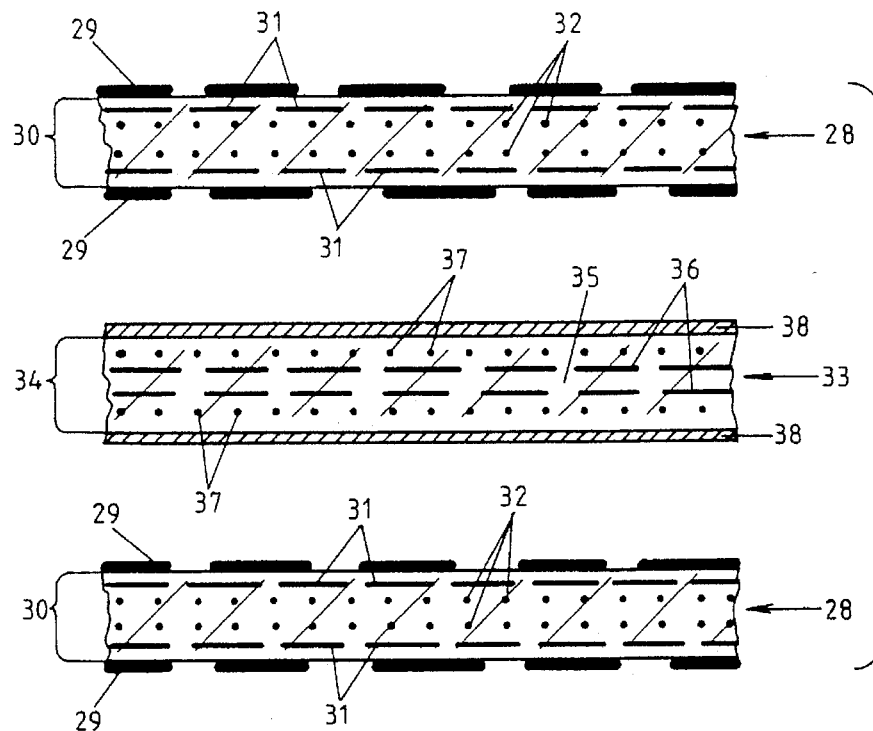

FIGS. 13–16 illustrate a somewhat different process for the manufacture of a multilayer PWB according to the invention. As is indicated in FIG. 13, use is made in this case of two double-sided PWBs 28 or base substrates, which each contain two layers of copper traces 29 provided by the subtractive method or the additive method. The core 30 of the PWBs 28 is again composed of a matrix of cured epoxy resin reinforced with three schematically indicated layer 31 and 32 of unidirectional reinforcing filaments. The filaments in the layers 31 extend in the 0° direction and cross the filaments in the layers 32 extending in the 90° direction at an angle of 90°. The core 30 may be made by, e.g., laminating three crosswise stacked UD prepregs of reinforcing filaments impregnated with epoxy resin at elevated temperature and increased pressure, thus curing the epoxy resin. The overall thickness of the two outer prepregs in this case is the same or virtually the same as the thickness of the centre prepreg. Between the two base substrates 28 there is provided one intermediate substrate 33, which is composed of a hard core layer 34 of a thickness of 0,4 mm made up of a matrix 35 of cured epoxy resin reinforced with three UD filaments layers 36 and 37 extending in the 0° and 90° directions, respectively. Here also the combined thickness of the two outer UD layers is equal to or virtually equal to the thickness of the inner UD layer. The hard core layer 34 is provided on both sides with a still plastically deformable glue or adhesive layer 38 having a thickness of 35 μm. The adhesive layer 38 may be made up of the same material as the glue layer 15 described hereinbefore. Next, the two base substrates 28 and the intermediate substrate 33 therebetween are joined together under the effect of heat and pressure to form a laminate (the situation indicated in FIG. 14). In this process the hard core layer 34 of the intermediate substrate 33 is contacted or virtually contacted on both sides with the opposing copper traces 29 of the base substrates 28, while the voids between these traces on either side of the intermediate substrate are filled with the adhesive material 38. After the voids between the traces have been filled with glue, said glue is cured, substantially completing a multilayer PWB 39. The PWB 39 has four layers of copper traces.

Figure 14:
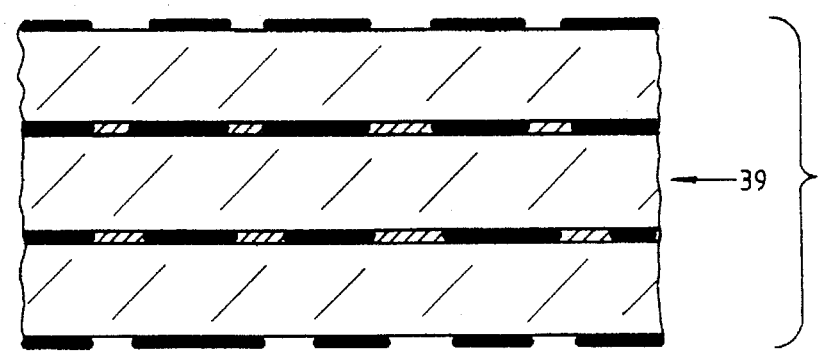
Figure 15:
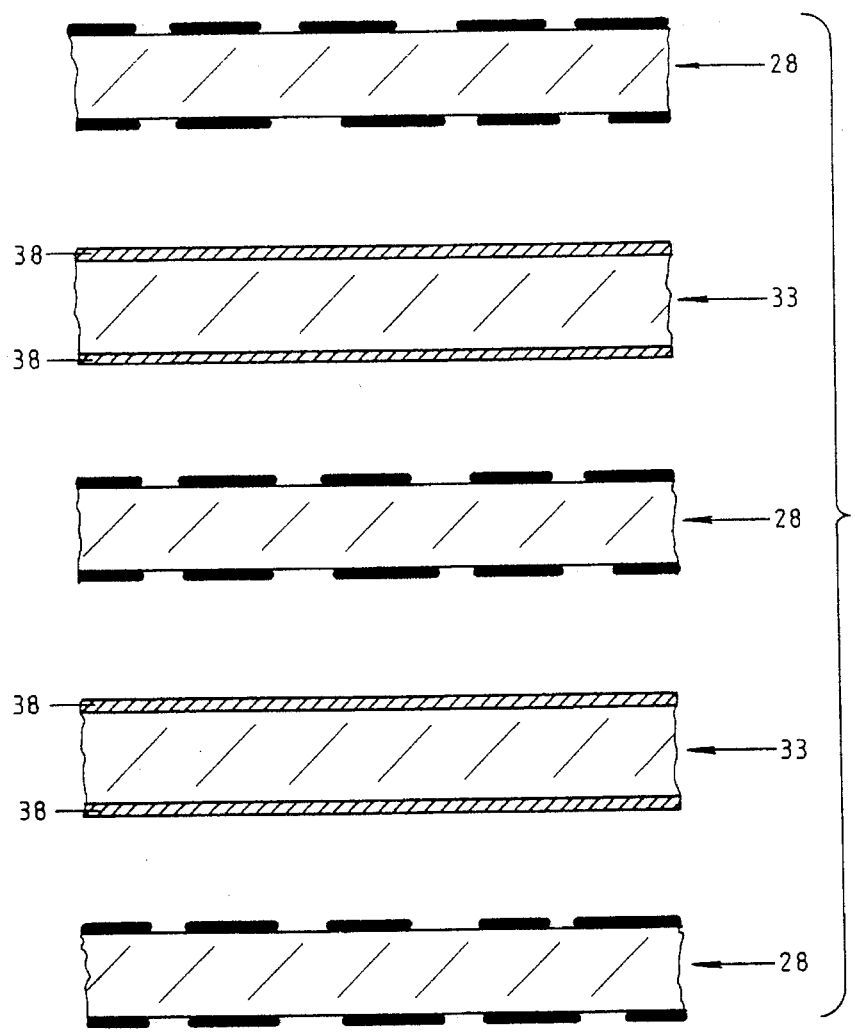
Figure 16:
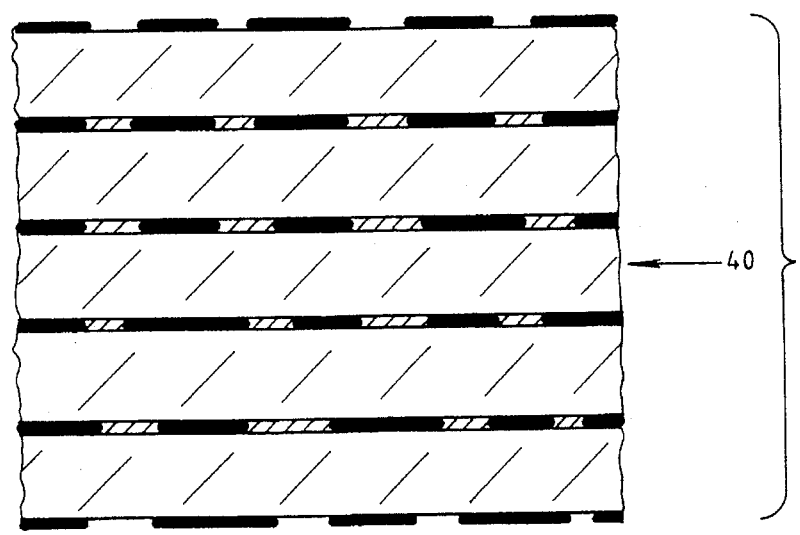

In FIGS. 15 and 16 it is shown how in accordance with the principle described for FIGS. 13 and 14 it is also possible to manufacture a PWB 40 with six layers of copper traces, corresponding parts being indicated with the same reference numerals. As is indicated in FIG. 15, use is made in this case of three base substrates 28. An intermediate substrate 33 is sandwiched between each pair of base substrates 28. In the manner described hereinbefore the combination of three base substrates 28 and two intermediate substrates 33 shown in FIG. 15 is next joined together under the effect of heat and pressure into a laminate, which after the curing of the glue 38 forms a virtually finished multilayer PWB 40 containing six layers of copper traces. PWBs with a far greater number of layers of copper traces can be manufactured in a similar manner.

The core of the intermediate substrate and of the base substrate may be built up from a number of UD prepregs stacked in such a way that their reinforcing filaments cross each other, it is also possible to employ an alternative preparative process. Notably, the base substrate and the intermediate substrate can be manufactured by a continuous process, in which a laminate composed of the desired number of layers of stretched reinforcing filaments not bound in the form of a fabric is laid on a conveyor belt, with the filaments of superposed layers crossing each other. To the thus formed laminate of filament layers liquid thermosetting resin is applied, after which the laminate provided with resin is passed through a double belt press, in which, under the effect of heat and pressure, the filament layers are impregnated with resin and the resin is cured. As it leaves the double belt press the wholly or partially cured laminate can then be provided on one or on both sides with the relatively thin, non-sticking glue layer mentioned hereinbefore, whereupon said intermediate substrate is ready.

According to another conceivable process the cores of both the base substrate and the intermediate substrate are manufactured from several unidirectional laminates which preferably cross each other at an angle of 90°, are completely or virtually completely cured, and are bonded together with the aid of an adhesive layer. Laminates based on crossing UD laminates bonded together with an adhesive layer can be manufactured in static, optionally multiopening presses, as well as in autoclaves, double belt presses, and so-called vacuum bags.

In an embodiment of the process according to the invention a multilayer PWB with four layers of copper traces was manufactured as follows:

The starting material selected was a UD prepreg of Twaron®, an aramid fibre ex Akzo, an epoxy resin, in this case Epikote 828 ex Shell, and a curing agent, in this case HY 917 ex Ciba Geigy. The fibre content of the prepreg was 50% of volume, the thickness 0,1 mm. The prepreg was cut up into 12 square pieces measuring 610×610 mm. Two base substrates were manufactured; in each manufacturing process, four of these pieces were stacked between two copper foils, with the two centre prepregs disposed at an angle of 90° in relation to the top and bottom UD prepreg layers. The two stacks of materials thus made were cured in an autoclave under a pressure of 8 Bar and at a temperature of 180° C. over a period of three hours. The remaining four prepregs were stacked between two release films, with the two centre prepregs rotated through an angle of 90° in relation to the top and bottom layers of UD prepreg. This stack of material was also introduced into an autoclave and then cured under the same conditions as the aforementioned base substrates. Following the finishing of the three thus formed laminates the desired patterns were etched into the copper layers, while the release film was removed from the intermediate substrate. The intermediate substrate was then coated with a glue also based on Shell's Epikote 828 epoxy resin and filled with 30% fine quartz powder. In a final step the three laminates were joined together with the intermediate substrate at the centre, cf. also FIG. 13. This stack of laminates was placed in an autoclave and the epoxy-glue layer cured under a pressure of 10 Bar and at a temperature of 180° C. over a period of 30 minutes. In this way a 4-layer multilayer as drawn in FIG. 14 was formed.

To said thermosetting matrix resin there may be added in a conventional manner fillers such as fine quartz powder and, say, glass powder such as boron silicate glass powder.

Although it is preferred to use a resin based on epoxy resin for the base substrate matrix, it is also possible in principle to employ other resins, such as cyanate resins, unsaturated polyester (UP) resins, vinyl ester resins, acrylate resins, BT-epoxy resin, bismaleimide resin (BMI), polyimide (PI), phenol resins, triazines, polyurethanes, biscitraconic resin (BCI). Alternatively, use may be made of combinations of the aforementioned resins, and it is also possible to blend said resins with certain appropriate thermoplastic resins, such as PPO, PES, PSU, and, int. al., PEI.

A great many polymers are suitable to be used for the described glue layer, more particularly thermosetting resins, such as epoxy resin (EP), polyurethane (PU), vinyl ester (VE), polyimide (PI), bismaleimide (BMI), biscitraconic (BCI), cyanate esters, triazines, acrylates, and blends thereof. Prior to application many additives can be added to the glue, such as catalysts, inhibitors, thixotropic agents, and especially fillers. These fillers are preferably selected from the following group of materials: quartz powder, glass powder, ceramic powders, such as aluminium oxide powder. It is preferred that the fillers to be used should have a low thermal coefficient of expansion and a low dielectric constant. Favourable results can be attained by using hollow spheres as filler, which spheres may be of either a polymeric material or a ceramic material or glass.

For the aforementioned reinforcing filaments it is preferred to use filament yarns, although it is also possible to use non-continuous fibres. According to the invention the reinforcing yarns are preferably selected from the following group of materials: glass, such as E-glass, A-glass, C-glass, D-glass, AR-glass, R-glass, S1-glass, and S2-glass, and various ceramic materials, such as aluminium oxide en silicon carbide. Furthermore, fibres based on polymers are suitable, more particularly liquid crystalline polymers, such as paraphenylene terephthalamide (PPDT), polybenzobisoxazole (PBO), polybenzobisthiazole (PBT), and polybenzoimidazole (PBI), as well as fibres based on polyethylene terephthalate (PETP) and polyphenylene sulphide (PPS).

Within the framework of the invention various changes may be made.

We claim:

1. A method of manufacturing a multilayer printed wire board comprising lamination bonding at least one hard base substrate (8) having conductive traces (7) on both sides thereof and having voids between said conductive traces and at least one intermediate substrate (9) comprising a hard core layer (10) comprising a flowable adhesive layer (15) on at least a side thereof facing the conductive traces (7) of the base substrate (8), the lamination being conducted under a pressure sufficiently high thereby bringing the core layer (10) of the intermediate substrate (9) at least substantially into contact with the conductive traces (7) of the base substrate (8) with the adhesive (15) filling the voids between the traces (7), and wherein the base substrate (8) and the intermediate substrate (9) comprising a fiber-reinforced matrix material, the reinforcement being in the form of a crosswise arrangement of layers of unidirectionally oriented fibers.

2. A method according to claim 1 wherein the intermediate substrate (9) is provided with the flowable adhesive layer (15) on one side of its hard core layer (10) and has conductive traces on the other side of its hard core layer.

3. A method according to claim 2, wherein an intermediate substrate (9) is provided on both sides of the base substrate (8).

4. A method according to claim 2 or 3 wherein after conductive traces (7) have been formed on an intermediate substrate (9), there is provided on one or on both outer sides of a laminate (17) formed by lamination bonding of the intermediate substrate and the base substrate a further intermediate substrate (9) which is provided with a flowable adhesive layer (15) on one side of the hard core layer (10) thereof and the other side of the core of the further intermediate substrate being equipped to form conductive traces.

5. A method according to claim 4 wherein after conductive traces (7) have been formed on the outside of the intermediate substrate (9), that had been provided on the formed laminate (17), additional intermediate substrates (9) and conductive traces (7) are lamination bonded thereto until the final laminate (18), having the desired number of layers with conductive traces, is obtained.

6. A method according to claim 1, wherein the intermediate substrate (33) is provided with the flowable adhesive layer (38) on both sides of the hard core layer.

7. A method according to claim 6 wherein the intermediate substrate (33) is sandwiched between two adjacent base substrates (28), and pressure is exerted on the laminate during the laminating process as will bring said hard core layer (34) of the intermediate substrate (33) at least substantially into contact with the conductive traces (29) of the two base substrates (28) and fill any void between these traces (29), on either side of the intermediate substrate (33), with the flowable adhesive material (38).

8. A method according to claim 7 wherein each of a plurality of n intermediate substrates (33), with n being an integer higher than 1, is sandwiched between adjacent base substrates, the number of base substrates (28) thus being n+1, followed by lamination.

9. A method according to claim 7, wherein lamination is conducted under increased pressure and elevated temperature.

10. A method according to claim 9, wherein the thickness of each intermediate substrate (9, 33) is of the same order of magnitude as that of the base substrates (8, 28).

11. A method according to claim 1, wherein the thickness of the hard core layer (10, 34) of each intermediate substrate (9, 33) is 0.025–0.6 mm, and the thickness of each flowable adhesive layer (15, 38) on one or both sides of the intermediate substrate (9, 33) is of the same order of magnitude as that of the conductive traces (7, 29).

12. A method according to claim 1, wherein the base substrates (8, 28) are provided with electrically conductive vias in the Z-direction.

13. A method according to claim 1 wherein after each laminating step electrically conductive vias in the Z-direction are formed.

14. A method according to claim 1, wherein the flowable adhesive layer (15, 38) provided on one or both sides of the hard core layer (10, 34) of the intermediate substrate comprising a glue based on an uncured or only partially cured thermosetting synthetic material.

15. A method according to claim 1, wherein the intermediate substrate (9, 33) is provided with a flowable adhesive layer (15, 38) having a thickness in the range of 1 to 70 μm.

16. A method according to claim 1, wherein the matrix (4, 11) of the core layers (8, 10) of the substrates (8, 9) is selected from the following group of thermosetting synthetic materials: cyanate resins, unsaturated polyester (UP) resins, vinyl ester resins, acrylate resins, BT-epoxy resin, bismaleimide resin (BMI), polyimide (PI), phenol resins, triazines, polyurethanes, biscitraconic resin (BCI), and combinations thereof.

17. A method according to claim 1 wherein the matrix of the core layers of the substrates is composed of a thermoplastic synthetic material comprising a material selected from the group consisting of polyimide and the thermoplastic aramids.

18. A method according to claim 1, wherein the matrix of the core layers of the substrates comprises thermoplastic as well as thermosetting synthetic materials.

19. A method according to claim 1, wherein the reinforcing fiber is selected from the following group of materials: A-glass, AR-glass, C-glass, D-glass, E-glass, R-glass, S1-glass, S2-glass, quartz, silica, paraphenylene terephthalamide (PPDT), polybenzobisoxazole (PBO), polybenzobisthiazole (PBT), and polybenzoimidazole (PBI), polyethylene terephthalate (PETP), polyphenylene sulphide (PPS), aluminium oxide, and silicon carbide.

20. A method according to claim 1 wherein the adhesive layer is comprised of a thermosetting synthetic material selected from the group consisting of epoxy resin (EP), polyurethane (PU), vinyl ester (VE), polyimide (PI), bismaleimide (BMI), biscitraconic (BCI), cyanate esters, triazines, acrylates, and blends thereof.

21. A method according to claim 1 wherein the at least one unidirectionally-reinforced base substrate and unidirectionally-reinforced intermediate substrates are balanced and mid-plane symmetric unidirectionally-crossply laminates.

22. A method of making a multilayer printed wire board in which at least one semiconductorchip is incorporated comprising placing at least one chip on a base-substrate, thereby conductively connecting said at least one chip with circuitry on the base-substrate, and then laminating onto the chip-containing base-substrate an adhesive-coated intermediate substrate provided with appropriate spaces so as to surround said at least one chip attached to the base-substrate, the base substrate and the intermediate substrate comprising a fiber-reinforced matrix material, the reinforcement being in the form of a crosswise arrangement of layers of unidirectionally (UD) oriented fibers.

* * * * *

UNITED STATES PATENT AND TRADEMARK OFFICE
CERTIFICATE OF CORRECTION

PATENT NO. : 5,592,737
DATED : January 14, 1997
INVENTOR(S) : E. Middelman; P.H. Zuuring It is certified that error appears in the above-indentified patent and that said Letters Patent is hereby corrected as shown below:

Title page, item [73] Assignee;

Change "Akzo Nobel N.V." to --AMP-Akzo Linlam VOF--.

Signed and Sealed this

Seventh Day of April, 1998

Attest:

BRUCE LEHMAN

Attesting Officer

Commissioner of Patents and Trademarks